(12) United States Patent
Ebuchi

(10) Patent No.: US 7,236,066 B2
(45) Date of Patent: Jun. 26, 2007

(54) FILM BULK ACOUSTIC RESONATOR AND FILTER CIRCUIT INCLUDING A PLURALITY OF FILM BULK ACOUSTIC RESONATORS

(75) Inventor: Yasuo Ebuchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 11/197,399

(22) Filed: Aug. 5, 2005

(65) Prior Publication Data

US 2006/0255883 A1    Nov. 16, 2006

(30) Foreign Application Priority Data

May 13, 2005  (JP)  ............................. 2005-141713

(51) Int. Cl.
*H03H 9/00* (2006.01)
*H01L 41/00* (2006.01)
*H01L 29/00* (2006.01)
*H01L 47/00* (2006.01)
*H01L 29/06* (2006.01)
*H02N 2/00* (2006.01)

(52) U.S. Cl. ..................... 333/187; 310/312; 310/367; 257/1; 257/9

(58) Field of Classification Search ................ 257/1–9; 310/367, 312; 333/187–189
See application file for complete search history.

(56) References Cited

U.S. PATENT DOCUMENTS

| 6,150,703 | A | 11/2000 | Cushman et al. ........... 257/415 |
| 6,215,375 | B1 | 4/2001 | Larson, III et al. ......... 333/187 |
| 6,483,229 | B2 | 11/2002 | Larson, III et al. ......... 310/348 |
| 2004/0017130 | A1* | 1/2004 | Wang et al. ................ 310/311 |

* cited by examiner

*Primary Examiner*—Jayprakash Gandhi
*Assistant Examiner*—Andrés López-Esquerra
(74) *Attorney, Agent, or Firm*—Oblon, Spivak, McClelland, Maier & Neustadt, P.C.

(57) ABSTRACT

A film bulk acoustic resonator includes a first electrode, a piezoelectric film disposed on the first electrode, a second electrode disposed on the piezoelectric film or disposed above the piezoelectric film, and an additional film disposed on and abutting the piezoelectric film. The additional film has at least one pair of opposite sides which are non-parallel with each other. The additional film includes a plurality of stripe-shaped openings.

11 Claims, 10 Drawing Sheets

FILM BULK ACOUSTIC RESONATOR AND FILTER CIRCUIT INCLUDING A PLURALITY OF FILM BULK ACOUSTIC RESONATORS

CROSS REFERENCE TO RELATED APPLICATIONS AND INCORPORATION BY REFERENCE

This application is based upon and claims the benefit of priority from prior Japanese Patent Application P2005-141713 filed on May 13, 2005; the entire contents of which are incorporated by reference herein.

BACKGROUND OF THE INVENTION

1. Field of the Invention

The present invention relates to an acoustic resonator, and more specifically, to a film bulk acoustic resonator and a filter circuit used in high frequency bands.

2. Description of the Related Art

Recently, wireless communication systems such as mobile telecommunication devices, and high-speed data transfer wireless local area networks (LAN) use high frequency bands which exceed the GHz range. A film bulk acoustic resonator (FBAR) is used as a high frequency element in high frequency electronic equipment of these types of wireless communication systems.

In the past, bulk (ceramic) dielectric resonators, surface acoustic wave elements (SAW) have been used as resonators for high frequency bands. Compared to these resonators, the FBAR is better suited for miniaturization, and has attributes allowing the FBAR to respond better to even higher frequencies. Thus, there is continued development of high frequency filters and resonance circuits using the FBAR.

In a basic structure of a FBAR, a piezoelectric film, such as aluminum nitride (AlN) and zinc oxide (ZnO), is sandwiched between a first electrode and a second electrode, which are opposed to each other. A resonator of the FBAR is disposed above a cavity provided below the first electrode, in order to attain high performance. In general, the piezoelectric film has a larger area than the first and second electrodes.

The FBAR uses resonance of longitudinal waves that are transverse extension (TE) waves propagating through the piezoelectric film between the first and second electrodes. However, in the FBAR, the longitudinal waves are generated as the primary vibration mode, and parasitic transverse waves that are transverse shear (TS) waves, are also generated. The transverse waves generated in the resonator are reflected at end portions of the first and second electrodes and end portions of the piezoelectric film where mass densities of the FBAR change drastically. For example, when the geometry of the first and second electrodes is a square or a rectangle, the transverse waves which are reflected at the end portions of the first and second electrodes interfere with each other so as to generate spurious resonance. Thus, a spurious resonance in the resonant characteristic of the FBAR is generated due to a parasitic resonance induced by the transverse waves.

In order to control the spurious resonance in the FBAR, it has been proposed that the first and second electrodes are formed as an irregular polygon (refer to United States Patent Application Specification No. 006215375A) However, when the electrode geometry is an irregular polygon, it is difficult to reduce the area occupied by a FBAR element on a substrate. Thus, it is desirable to manufacture the FBAR element with an electrode geometry such as a square shape, a rectangle shape, a round shape, and an ellipse shape, in order to miniaturize the FBAR.

SUMMARY OF THE INVENTION

A first aspect of the present invention inheres in a film bulk acoustic resonator, including a first electrode; a piezoelectric film disposed on the first electrode; a second electrode disposed on the piezoelectric film; and an additional film disposed on and abutting the piezoelectric film, the additional film having at least one pair of opposite sides which are non-parallel with each other.

A second aspect of the present invention inheres in a film bulk acoustic resonator, including a first electrode; a piezoelectric film disposed on the first electrode; a second electrode disposed on the piezoelectric film; and an additional film disposed above the second electrode, the additional film having at least one pair of opposite sides which are non-parallel with each other.

A third aspect of the present invention inheres in a filter circuit comprising a plurality of film bulk acoustic resonators, each of the film bulk acoustic resonators including: a first electrode; a piezoelectric film disposed on the first electrode; a second electrode disposed on the piezoelectric film; and an additional film disposed on and abutting the piezoelectric film or disposed above the piezoelectric film, the additional film having at least one pair of opposite sides which are non-parallel with each other; wherein one of the first and second electrodes for each of the film bulk acoustic resonators is electrically connected and the mass of the additional film for each of the film bulk acoustic resonators is different.

DETAILED DESCRIPTION OF THE INVENTION

Figure 1:
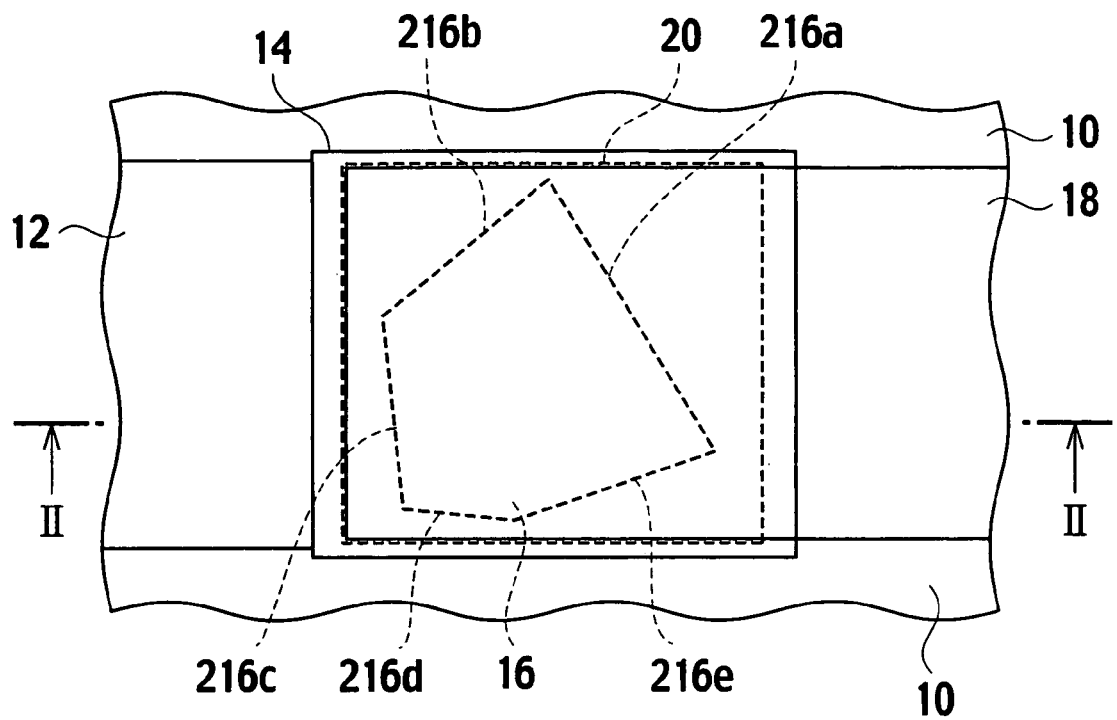
FIG. 1 is a plan view showing an example of a FBAR according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
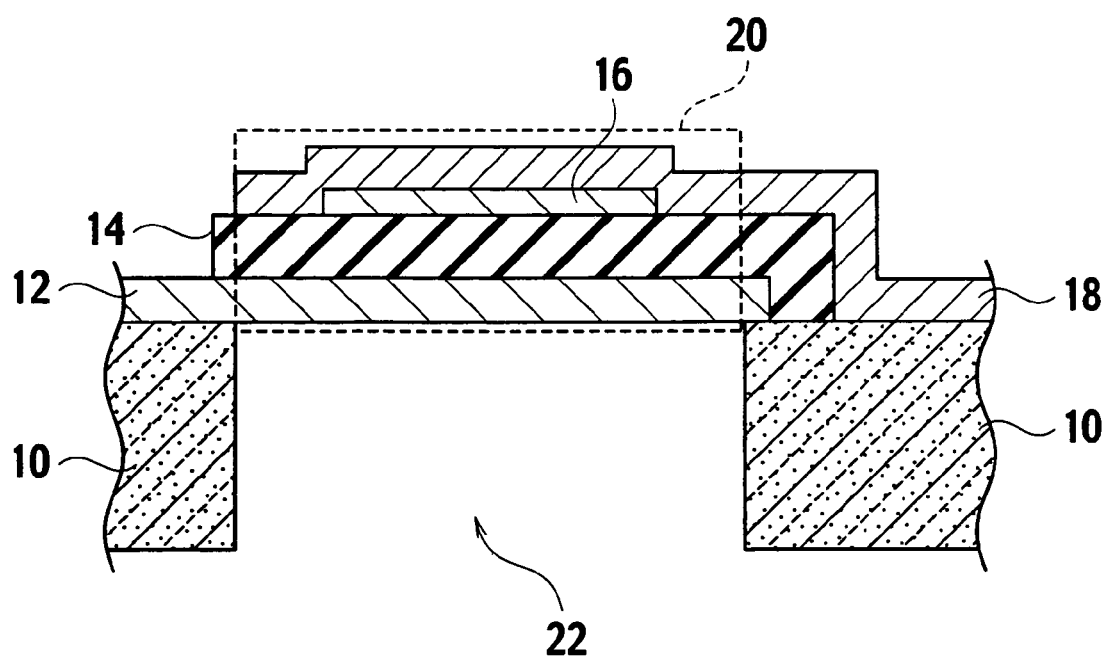
FIG. 2 is cross sectional view taken on line II—II of the FBAR shown in FIG. 1.

A FBAR according to an embodiment of the present invention includes a first electrode 12, a piezoelectric film 14 disposed on the first electrode 12, and a second electrode 18 facing the first electrode 12 to sandwich the piezoelectric film 14, as shown in FIG. 1. Moreover, as shown in FIGS. 1 and 2, an additional film 16 is disposed on the piezoelectric film 14 and abutting on the second electrode 18. The additional film 16 is formed in an irregular polygon shape having non-parallel sides 216a, 216b, 216c, 216d, and 216e. In other words, none of the sides 216a to 216e are parallel with respect to each other.

The first electrode 12, the piezoelectric film 14 and the second electrode 18 are supported by a substrate 10 having a cavity 22. A resonator 20 is defined by a region in which the first and second electrodes 12, 18 are facing each other to sandwich the piezoelectric film 14 in a region above the cavity 22.

A high frequency signal is transmitted in the piezoelectric film 14 in the resonator 20, by the resonance of bulk acoustic waves excited by the high frequency signal applied to the first or second electrodes 12, 18. For example, a GHz range high frequency signal that is applied from the first electrode 12 is transmitted to the second electrode 18 through the piezoelectric film 14 in the resonator 20.

In order to achieve a favorable resonant characteristic of the resonator 20, an AlN film or a ZnO film, which has excellent film quality including orientation of a crystal and uniformity of film thickness, may be used as the piezoelectric film 14. For the first electrode 12, a laminated metal film such as aluminum (Al) and tantalum aluminum (TaAl), a refractory metal such as molybdenum (Mo), tungsten (W) and titanium (Ti), a metallic compound including a refractory metal, and the like, may be used. For the second electrode 18, a metal such as Al, a refractory metal such as Mo, W and Ti, a metallic compound including a refractory metal, and the like, may be used.

For the additional film 16, various kinds of conductive materials exemplified for the second electrode 18 may be used. In addition, a piezoelectric material such as AlN, an insulating material of an oxide and a nitride, such as alumina ($Al_2O_3$), silicon oxide ($SiO_2$) and silicon nitride ($Si_3N_4$), and the like, may be used. Further, for the substrate 10, a semiconductor substrate such as silicon (Si), may be used.

The bulk acoustic waves transmitting the high frequency signals in the resonator 20 of the FBAR are longitudinal waves which propagate between the facing first and second electrodes 12, 18. Not only the longitudinal waves, but transverse waves are also generated in the resonator 20. The transverse waves travel parallel to an interface between the piezoelectric film 14, and the first and second electrodes 12, 18. The transverse waves traveling in the resonator 20 are reflected at end portions of the resonator 20 or end portions of the piezoelectric film 14, where mass densities change drastically.

In a current FBAR, a resonator and a piezoelectric film are formed in a square shape or a rectangle shape, in which opposite sides are parallel with each other. The transverse waves, which have traveled in a direction along sides of the resonator and the piezoelectric film, are reflected at the end portion of the resonator or the piezoelectric film to travel the same path in the opposite direction. The transverse waves reflected from the opposing end portions interfere with each other and generate spurious resonance.

Figure 3:
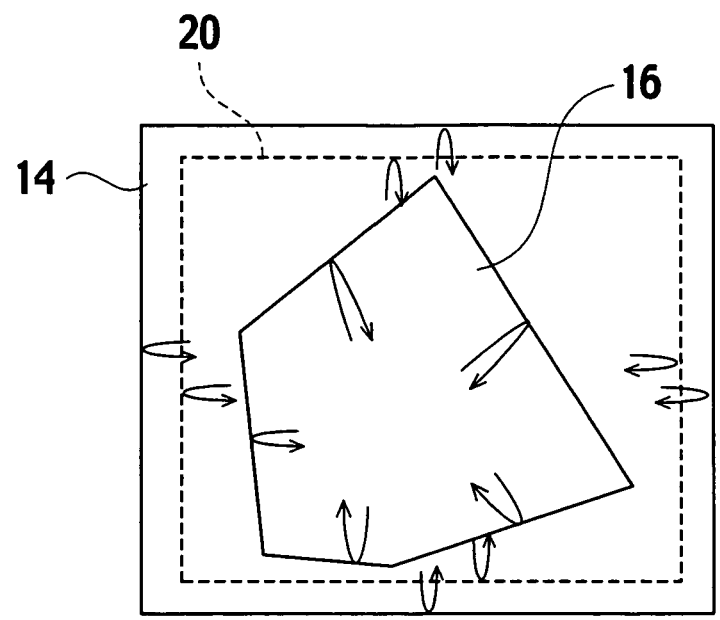
FIG. 3 is a view showing an example of interference of transversal wave in the FBAR according to the embodiment of the present invention.

In the embodiment of the present invention, the additional film 16 is formed in an irregular polygon shape having the non-parallel sides 216a to 216e. The additional film 16 is provided in a region of the resonator 20. As shown in FIG. 3, most of the transverse waves generated in the resonator 20 are reflected at the end portions of the additional film 16 where the mass density of the FBAR changes. The sides 216a to 216e in the opposite end portions of the additional film 16 are not parallel to each other. Therefore, the transverse waves reflected at the opposite end portions travel in different paths from each other. As a result, the transverse waves are attenuated by repeatedly reflecting at the end portions of the additional film 16.

Moreover, a part of the transverse waves are refracted at the end portion of the additional film 16 so as to be transmitted throughout a region of the additional film 16. Each side of the additional film 16 is provided so as to be non-parallel with each side of the resonator 20, the piezoelectric film 14 and the first and second electrodes 12, 18. Hence, the transmitted transverse waves are attenuated by being repeatedly reflected at each end portion of the resonator 20, the piezoelectric film 14, the first and second electrodes 12, 18, and the additional film 16.

As mentioned above, by using the additional film 16, it is possible to prevent spurious resonance due to the transverse waves generated in the resonator 20. In addition, miniaturization of the FBAR is possible, since each of the first and second electrodes 12, 18, and the piezoelectric film 14 is formed in a square shape or a rectangular shape. Moreover, it is also possible to miniaturize the FBAR by forming the first and second electrodes 12, 18 in a round shape or an elliptic shape. Even when the shape of the first and second electrodes 12, 18, or the resonator 20 is round or elliptic, interference between the transverse waves reflected at the opposing end portions thereof can be reduced by providing the additional film 16. Therefore, it is possible to prevent spurious resonance.

Figure 4:
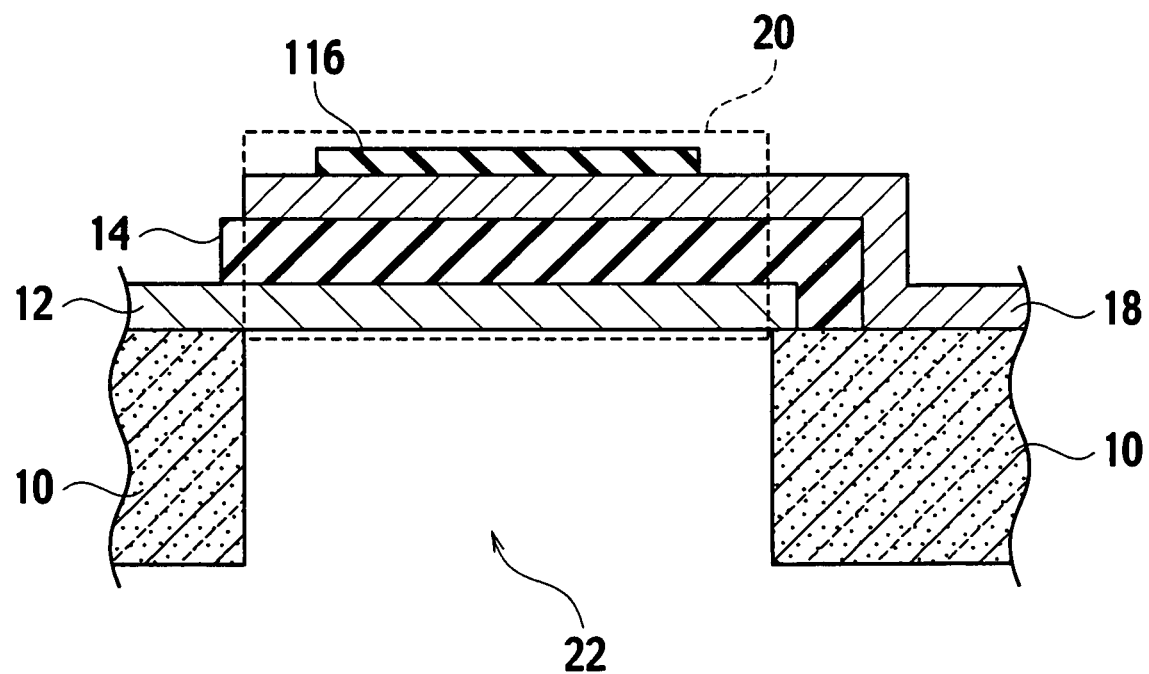
FIG. 4 is a cross sectional view showing another example of a FBAR according to the embodiment of the present invention.

Note that the additional film 16 is provided between the piezoelectric film 14 and the second electrode 18 in the embodiment of the present invention. However, when an insulating film is used as the additional film 16 between the piezoelectric film 14 and the second electrode 18 in conjunction with a conductive material and a piezoelectric material, an electromechanical coupling coefficient may be decreased by a parasitic series capacitance. In such a case, it is desired to dispose an additional film 116 on the second electrode 18, as shown in FIG. 4. Furthermore, the additional films 16 and 116 may be disposed above the second electrode 18 with an insulating film sandwiched therebetween.

The shape of the additional film 16 is a single irregular polygon, where all of the opposite ends are not parallel.

However, by using an additional film having a shape in which at least one pair of opposite ends are not parallel, it may be possible to reduce spurious resonance in the FBAR. Moreover, as an additional film, a plurality of separated films can be used. As shown in FIGS. 5 to 10, additional films 16a, 16b, 16c, 16d, 16e and 16f according to the embodiment of the present invention are shown. To simplify the explanation, only the piezoelectric film 14 and the additional films 16a to 16f are shown in the drawings.

Figure 5:
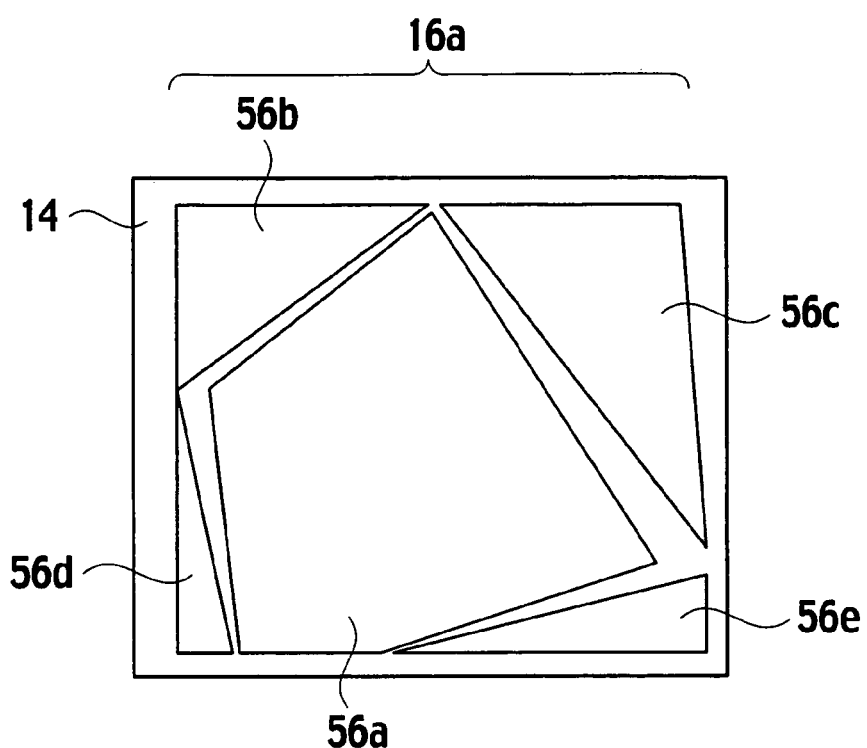
FIG. 5 is a view showing another example of an additional film of a FBAR according to the embodiment of the present invention.

As shown in FIG. 5, the additional film 16a is a group of mass-loading films 56a, 56b, 56c, 56d and 56e that are separated from each other on the piezoelectric film 14. In the additional film 16a, the mass-loading film 56a is surrounded by the mass-loading films 56b to 56e disposed along the end portions of the piezoelectric film 14. Each of the mass-loading films 56a to 56e is an irregular polygon shape in which opposite sides are not parallel. In addition, each side of the mass-loading film 56a is not parallel with each side of the mass-loading films 56b to 56e, which face each side of the mass-loading film 56a.

Figure 6:
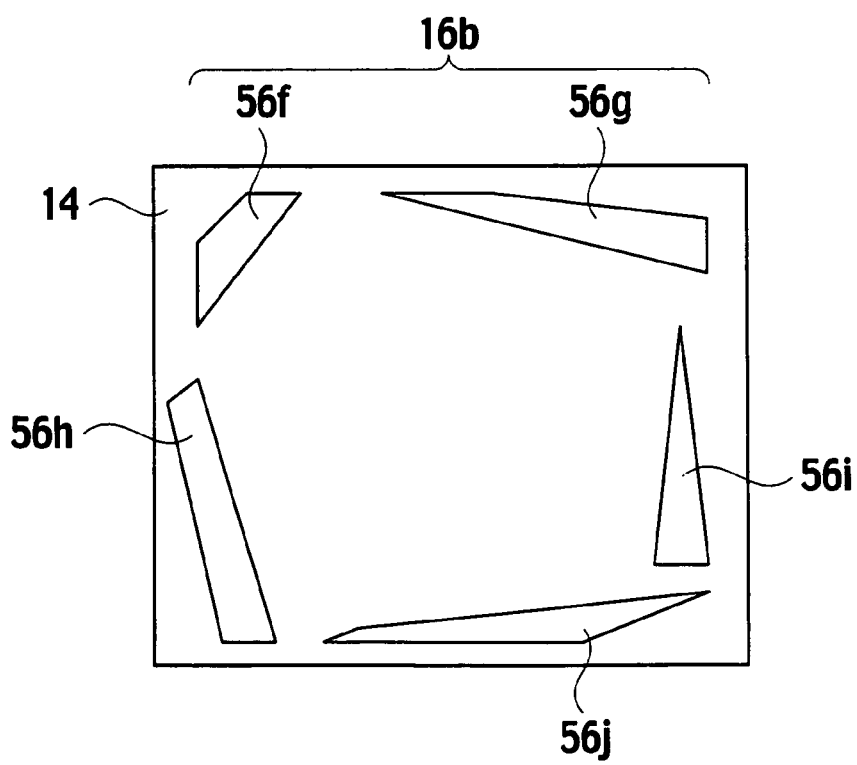
FIG. 6 is a view showing another example of an additional film of a FBAR according to the embodiment of the present invention.

As shown in FIG. 6, the additional film 16b is a group of mass-loading films 56f, 56g, 56h, 56i and 56j that are separated from each other along the end portions of the piezoelectric film 14. In each of the mass-loading films 56f to 56j, opposite sides are not parallel. Moreover, the facing sides which sandwich a region surrounded by the mass-loading films 56f to 56j, is not parallel.

Figure 7:
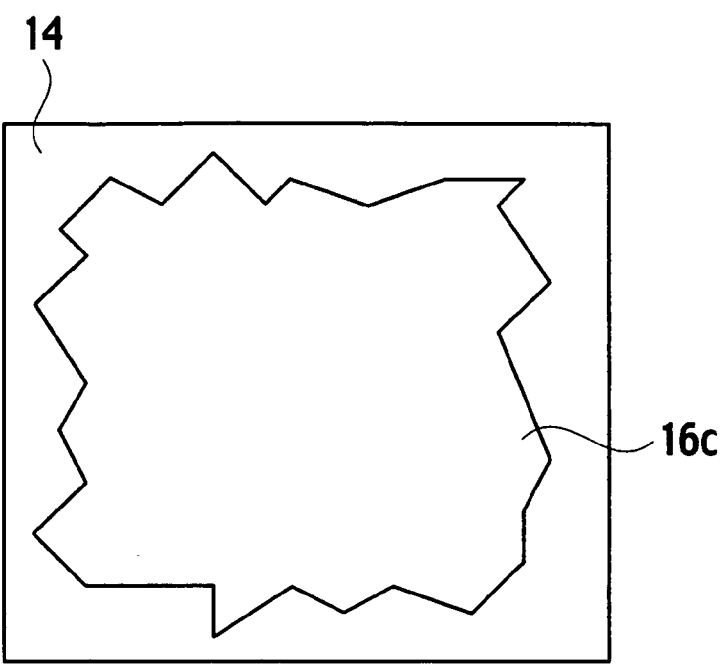
FIG. 7 is a view showing another example of an additional film of a FBAR according to the embodiment of the present invention.

As shown in FIG. 7, the additional film 16c has sawtooth-shaped notches on the edges thereof. In the additional film 16c, each of line segments of the notches on the edges is not parallel with almost all opposite line segments thereof.

Figure 8:
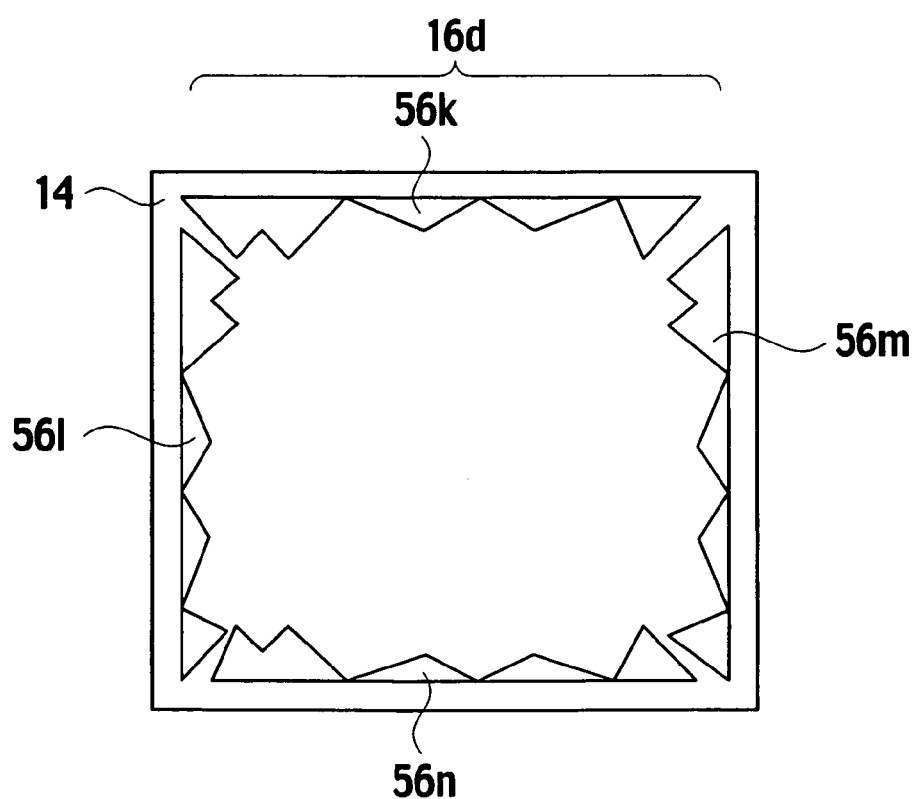
FIG. 8 is a view showing another example of an additional film of a FBAR according to the embodiment of the present invention.

As shown in FIG. 8, the additional film 16d includes a plurality of mass-loading films 56k, 56l, 56m and 56n disposed along the end portions of the piezoelectric film 14. In the additional film 16d, each of the mass-loading films 56k to 56n has sawtooth-shaped notches on the edges thereof, which are opposed to each other, to sandwich a region surrounded by the mass-loading films 56k to 56n. Each of line segments of the notches on the edges of the mass-loading films 56k to 56n is not parallel with almost all opposite line segments thereof.

Figure 9:
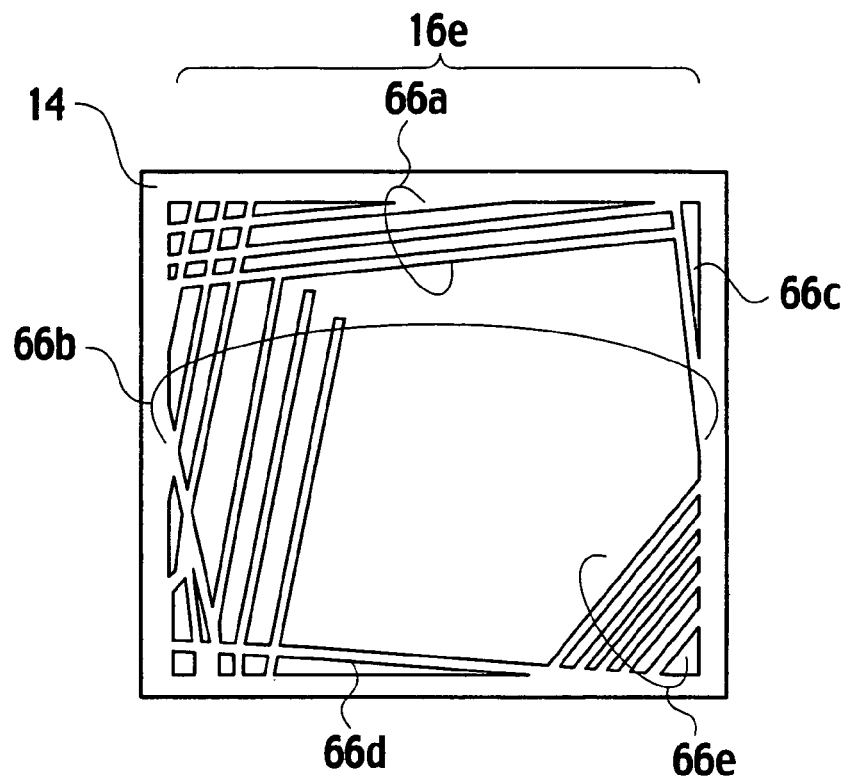
FIG. 9 is a view showing another example of an additional film of a FBAR according to the embodiment of the present invention.

As shown in FIG. 9, the additional film 16e includes a plurality of patterns. The patterns 66a, 66c, 66d and 66e define a plurality of stripe-shaped openings that are disposed around the pattern 66b. The patterns 66a, 66c, 66d and 66e are disposed along the end portions of the piezoelectric film 14. In the additional film 16e, in each of the patterns 66a to 66e, at least one of opposite sides is not parallel with opposite sides. Additionally, longitudinal sides of the openings disposed in each of the patterns 66a, 66b, 66d and 66e are not parallel with longitudinal sides of the openings in each of the opposite patterns 66a, 66b, 66d and 66e.

Figure 10:
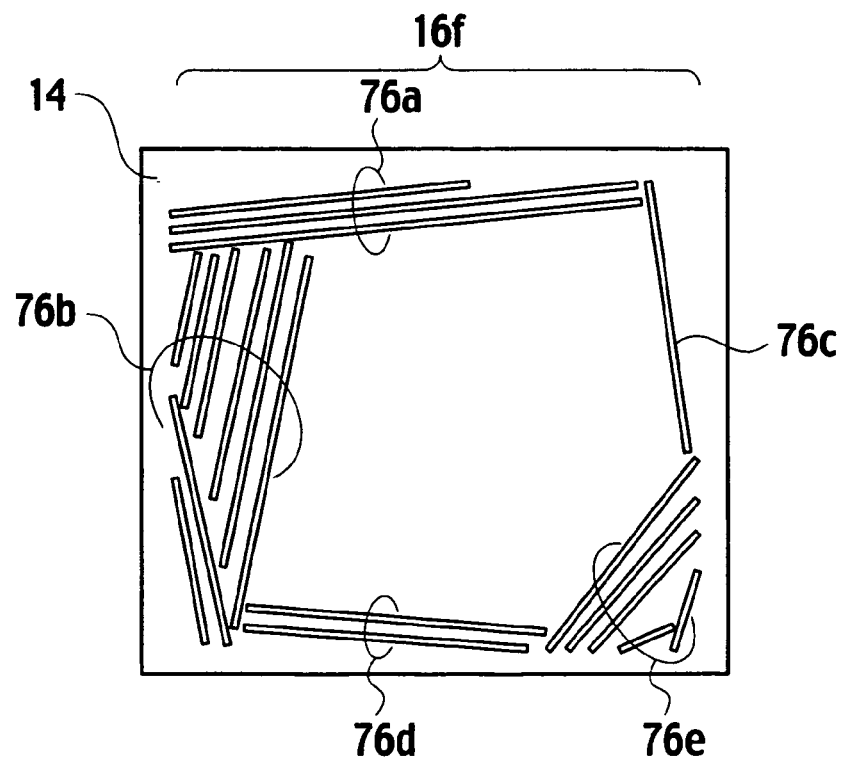
FIG. 10 is a view showing another example of an additional film of a FBAR according to the embodiment of the present invention.

As shown in FIG. 10, the additional film 16f is a group of stripe-shaped patterns 76a, 76b, 76c, 76d and 76e, in which line portions are disposed along the end portions of the piezoelectric film 14. In the additional film 16f, each longitudinal side of the line portions, which are opposed to each other sandwiching a region surrounded by the patterns 76a to 76e, is not parallel.

As described above, using the additional films 16a to 16f which include at least one pair of opposite non-parallel sides, it is possible to prevent the spurious resonance due to the transverse waves generated in the resonator 20. Further, the first and second electrodes 12, 18 and the piezoelectric film 14 can be a square shape, a rectangular shape, a round shape or an elliptic shape. Thus, it is possible to miniaturize a FBAR.

A description will be given of a manufacturing method of a FBAR according to the embodiment of the present invention with reference to cross-sectional views shown in FIGS. 11 to 15. Here, each cross-sectional view used for the explanation corresponds to the cross-section taken along the II—II line shown in FIG. 1.

Figure 11:
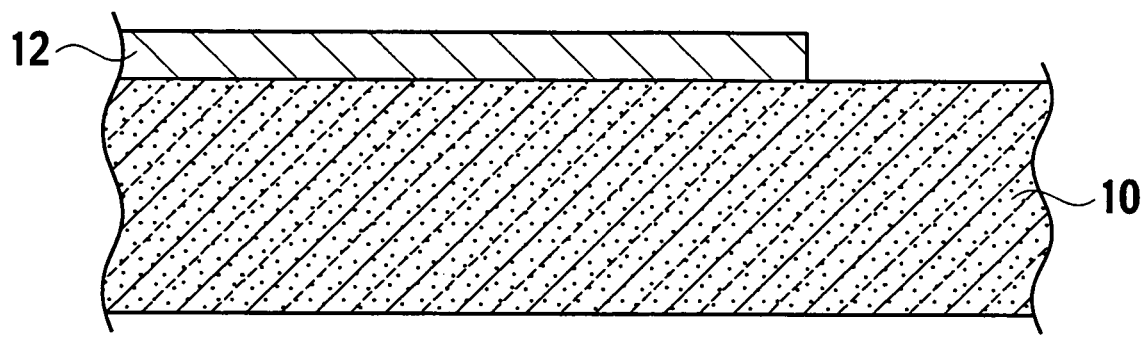
FIGS. 11 to 15 are cross sectional views showing an example of a manufacturing method of the FBAR according to the first embodiment of the present invention.

A conductive layer such as Mo, is deposited on a surface of a substrate 10, such as a Si semiconductor substrate, with a thickness of about 200 nm to about 300 nm, by sputtering and the like. As shown in FIG. 11, a first electrode 12 is formed by photoengraving and the like.

Figure 12:
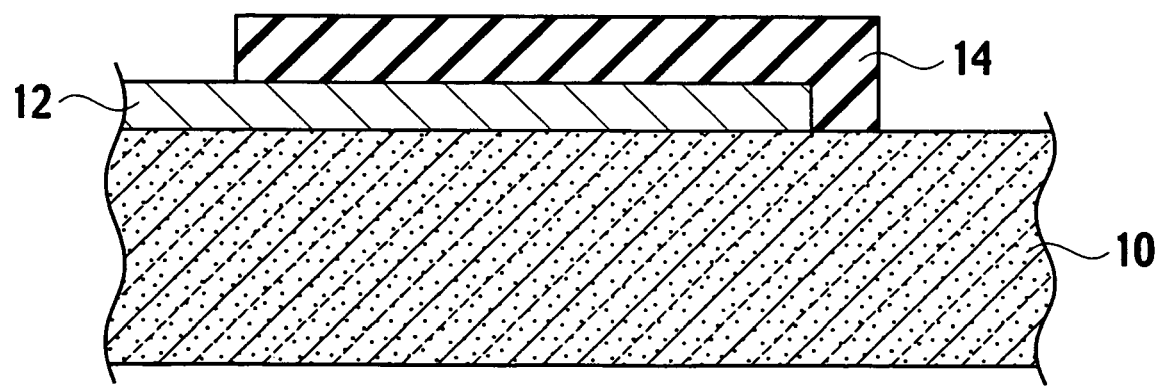

A piezoelectric layer with a predetermined thickness, such as AlN, is deposited by sputtering and the like, on the surface of the substrate 10 on which the first electrode 12 has been formed. For example, when a signal frequency is in a GHz band, the thickness of the piezoelectric layer is about 2 μm or less. As shown in FIG. 12, a piezoelectric film 14 is formed to cover an end portion of the first electrode 12, by photoengraving and the like.

Figure 13:
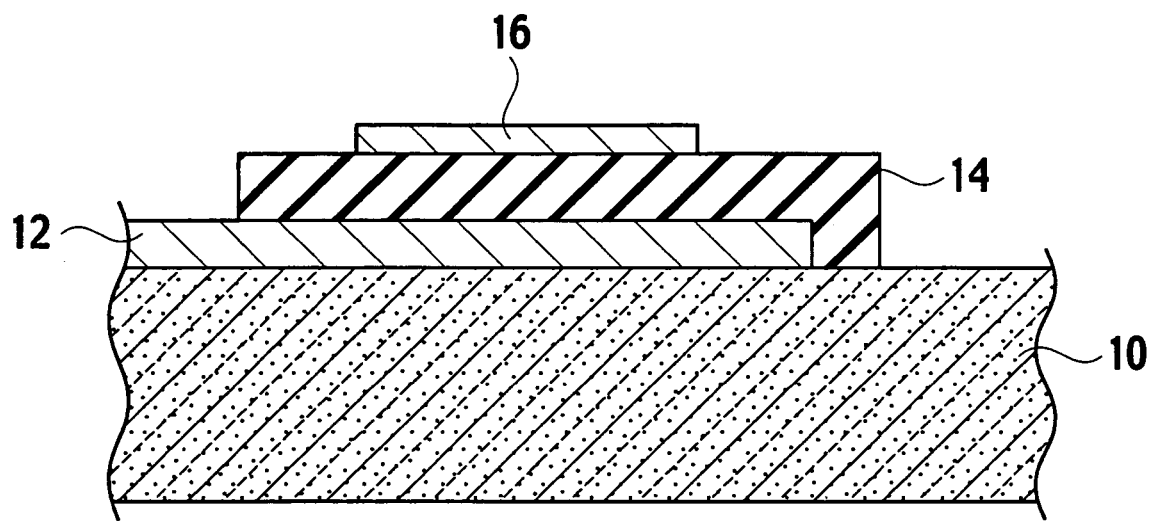

A conductive layer of a predetermined thickness, such as Mo, is deposited by sputtering and the like, on the surface of the substrate 10 on which the first electrode 12 and the piezoelectric film 14 have been formed. As shown in FIG. 13, an additional film 16 is formed on the piezoelectric film 14 to face the first electrode 12, by photoengraving and the like.

Figure 14:
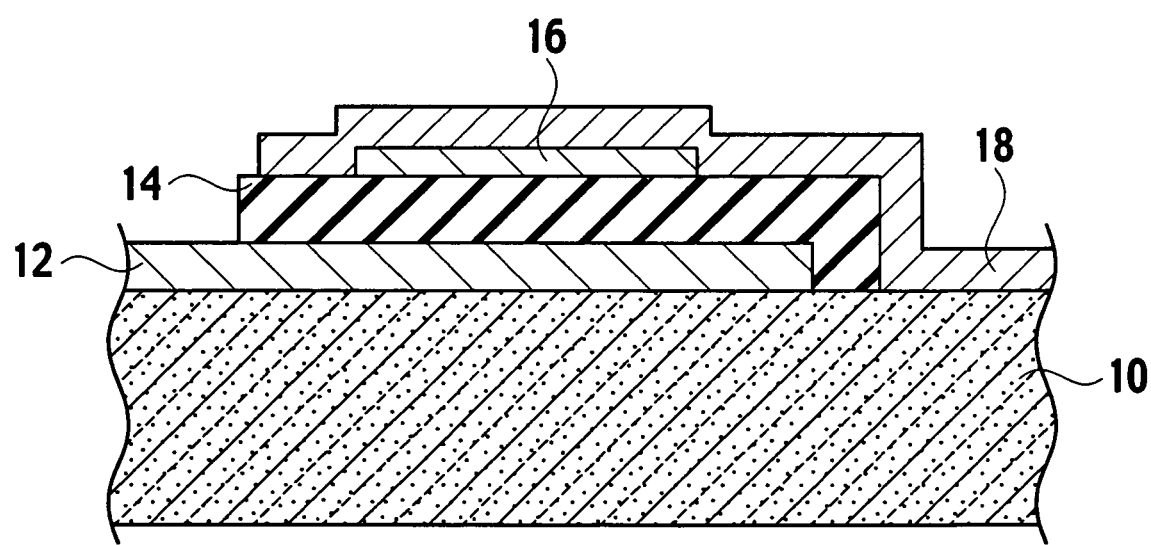

A conductive layer such as Mo, is deposited on the surface of the substrate 10 on which the first electrode 12, the piezoelectric film 14 and the additional film 16 have been formed, with a thickness of about 200 nm to about 300 nm by sputtering and the like. As shown in FIG. 14, a second electrode 18 is formed, by photoengraving and the like, to cover the additional film 16 on the piezoelectric film 14 and to extend to a side of the end portion of the first electrode 12 covered by the piezoelectric film 14.

Figure 15:
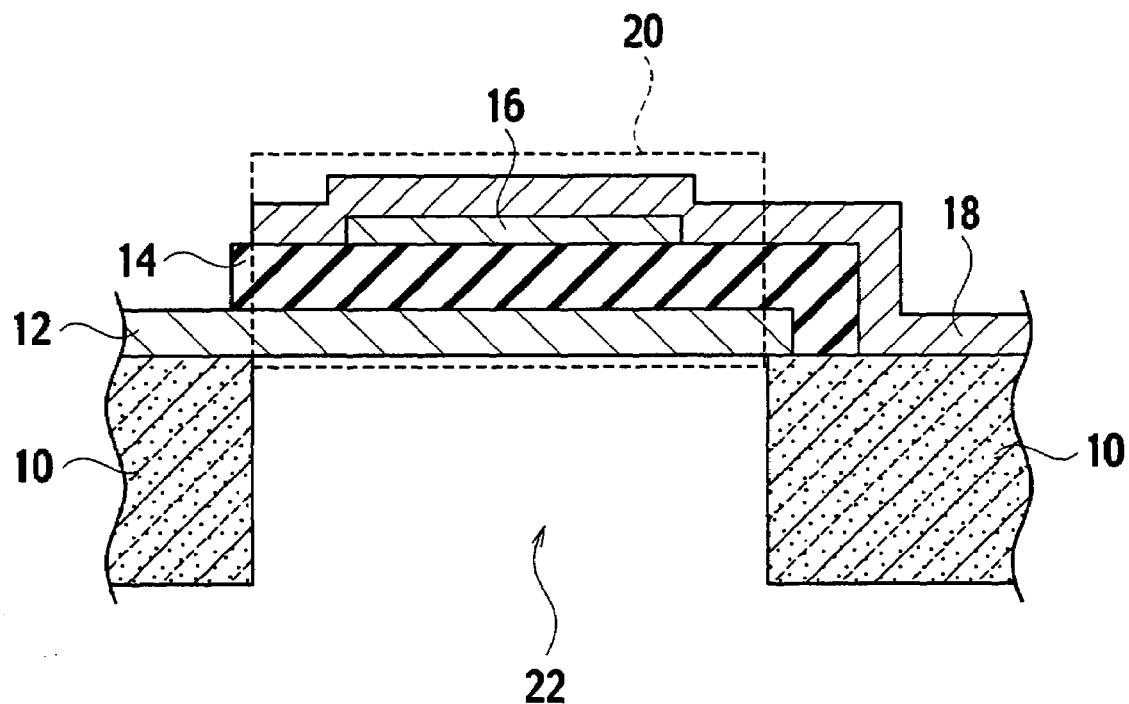

As shown in FIG. 15, the substrate 10 is selectively removed by photoengraving and the like, in a region where the first and second electrodes 12, 18 faces each other, so as to form a cavity 22. Thus, a FBAR according to the embodiment of the present invention is manufactured.

(Other Embodiments)

In the embodiment of the present invention, a single FBAR has been described. Generally, a plurality of FBARs are used for a filter, a voltage controlled oscillator, and the like, in a high frequency circuit. For example, a plurality of FBAR shaving different resonant frequencies and interconnected in a ladder structure are used in a filter circuit.

A resonant frequency f of a FBAR can be simply expressed by the following expression assuming that the thickness of a piezoelectric film 14 is h and the mass of the first and second electrodes 12, 18 including the additional film 16 is ρ.

$$f = A \cdot h^{-1} \cdot \rho^{-1/2} \quad (1)$$

Here, A is a constant. To provide FBAR shaving a different resonant characteristic, the mass ρ or the thickness his changed to modulate a resonant frequency. For example, the resonant frequency f can be modulated toward a lower frequency by increasing the mass ρ or the thickness h.

Figure 16:
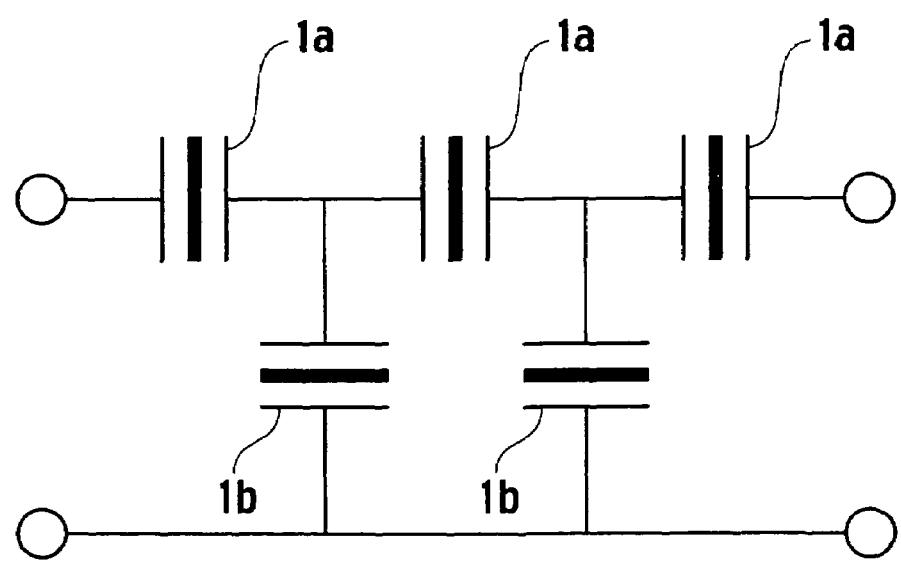
FIG. 16 is a block diagram showing an example of connection of FBARs used in a filter circuit according to an application example of the other embodiments of the present invention.

For example, a plurality of FBARs 1a, 1b having different resonant frequencies are used as a filter circuit by interconnecting the FBARs in a ladder structure, as shown in FIG. 16. An example of interconnecting two FBARs 1a, 1b will now be described.

Figure 17:
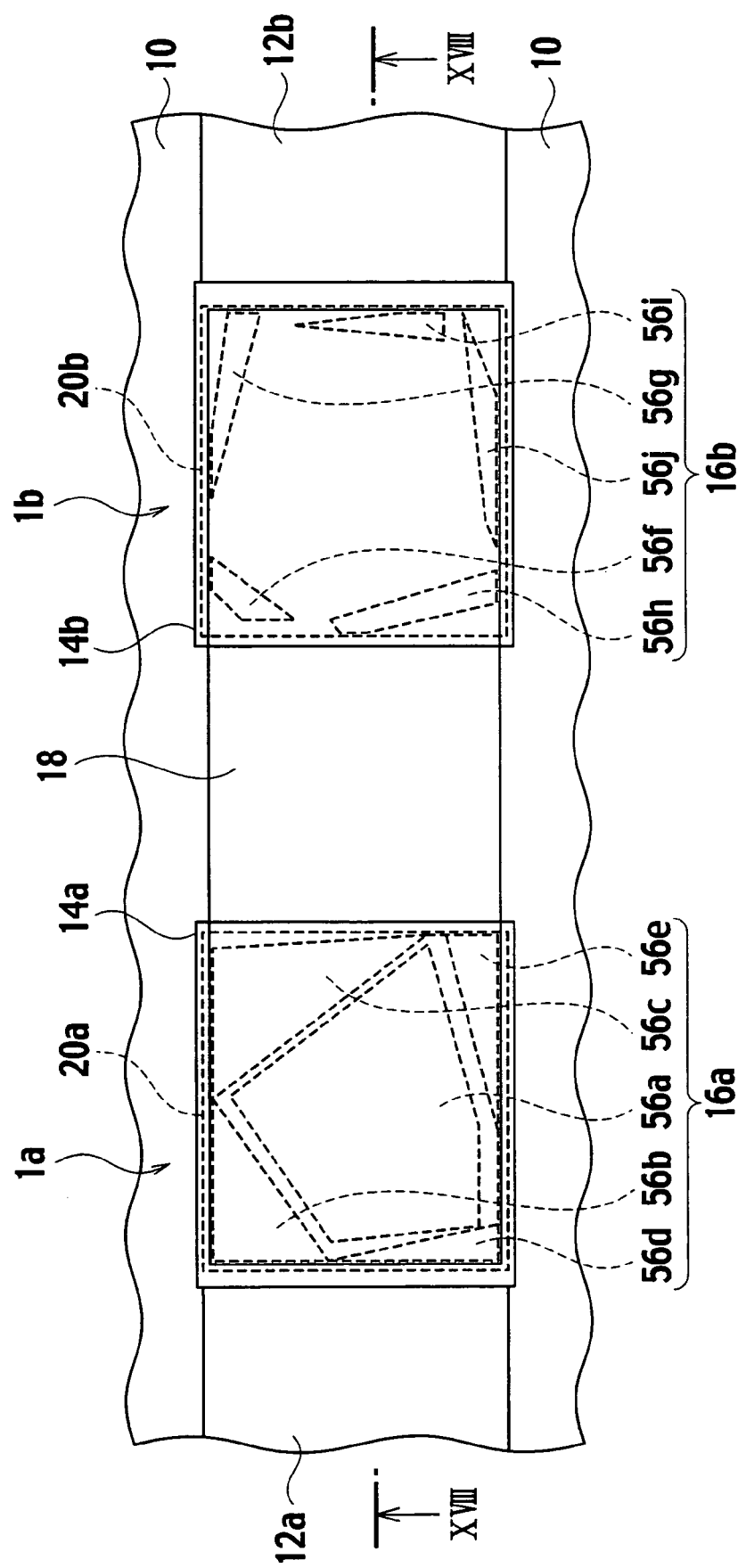
FIG. 17 is a plan view showing an example of a filter circuit according to an application example of other embodiments of the present invention.
Figure 18:
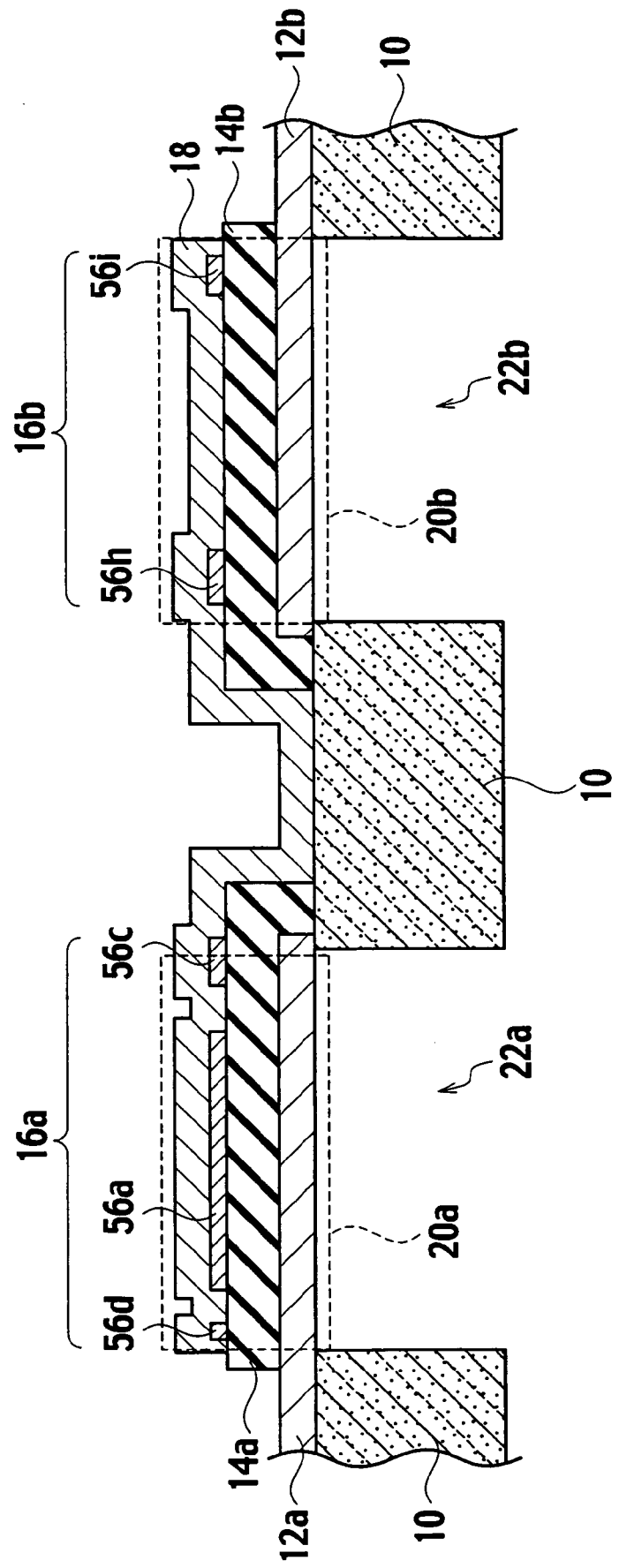
FIG. 18 is a cross sectional view taken on line XVIII—XVIII of the FBARs shown in FIG. 17.

As shown in FIGS. 17, 18, each of the FBARs 1a, 1b is disposed above cavities 22a, 22b which are provided in a substrate 10. The FBAR 1a includes a first electrode 12a, a piezoelectric film 14a, an additional film 16a, and a second electrode 18. The FBAR 1b includes a first electrode 12b, a piezoelectric film 14b, an additional film 16b, and the second electrode 18.

The FBARs 1a, 1b are connected in series, using the second electrode 18 in common. In the FBARs 1a, 1b, the thicknesses of the piezoelectric films 14a, 14b are substantially equal and the mass of the first and second electrode 12a, 18 and of the first and second electrode 12b, 18 are substantially equal. The shape and mass of the additional films 16a, 16b are different. For example, the mass of the additional film 16a is larger than the additional film 16b. Therefore, the resonant frequency of the FBAR 1a is lower than the FBAR 1b.

In the additional film 16a, each of mass-loading films 56a to 56e is an irregular polygon shape in which opposite sides are not parallel. In addition, each side of the mass-loading film 56a, which faces the mass-loading film 56b to 56e, is not parallel with each side of the mass-loading films 56b to 56e. In the additional film 16b, opposite sides in each of mass-loading films 56f to 56j are not parallel with each other. Furthermore, facing sides of the mass-loading films 56f to 56j, which sandwich a region surrounded thereby, are not parallel. Hence, it is possible to prevent spurious resonance due to transverse waves generated in resonators 20a, 20b.

Moreover, the shape of each of the first electrode 12a, 12b, the second electrode 18, and the piezoelectric films 14a, 14b is a square or a rectangle. Therefore, it is possible to miniaturize a filter circuit using the FBARs 1a, 1b.

In the above description, the FBARs 1a, 1b are electrically connected using the second electrode 18 in common. However, it is also applicable to electrically connect a plurality of FBARs using a first electrode for each of the FBARs.

The present invention has been described as mentioned above. However the descriptions and drawings that constitute a portion of this disclosure should not be perceived as limiting this invention. Various alternative embodiments and operational techniques will become clear to persons skilled in the art from this disclosure.

What is claimed is:

1. A film bulk acoustic resonator, comprising:
    a first electrode;
    a piezoelectric film disposed on the first electrode;
    a second electrode disposed on the piezoelectric film; and
    an additional film disposed on and abutting the piezoelectric film, the additional film having at least one pair of opposite sides which are non-parallel with each other,
    wherein the additional film comprises a plurality of stripe-shaped openings.

2. The film bulk acoustic resonator of claim 1, wherein each of the first and second electrodes has one of a square shape, a rectangular shape, a round shape, and an elliptic shape.

3. The film bulk acoustic resonator of claim 1, wherein the additional film is a conductive material.

4. The film bulk acoustic resonator of claim 1, wherein the additional film is a piezoelectric material.

5. A film bulk acoustic resonator, comprising:
    a first electrode;
    a piezoelectric film disposed on the first electrode;
    a second electrode disposed on the piezoelectric film; and
    an additional film disposed above the second electrode, the additional film having at least one pair of opposite sides which are non-parallel with each other,
    wherein the additional film comprises a plurality of stripe-shaped openings.

6. The film bulk acoustic resonator of claim 5, wherein each of the first and second electrodes has one of a square shape, a rectangular shape, a round shape, and an elliptic shape.

7. The film bulk acoustic resonator of claim 5, wherein the additional film is a conductive material.

8. The film bulk acoustic resonator of claim 5, wherein the additional film is a piezoelectric material.

9. The film bulk acoustic resonator of claim 5, wherein the additional film is an insulating material.

10. A filter circuit including a plurality of film bulk acoustic resonators, each of the film bulk acoustic resonators comprising:
    a first electrode;
    a piezoelectric film disposed on the first electrode;
    a second electrode disposed on the piezoelectric film; and
    an additional film disposed on and abutting the piezoelectric film or disposed above the piezoelectric film, the additional film having at least one pair of opposite sides which are non-parallel with each other, the additional film comprising a plurality of stripe-shaped openings;
    wherein one of the first and second electrodes for each of the film bulk acoustic resonators is electrically connected and the mass of the additional film for each of the film bulk acoustic resonators is different.

11. The filter circuit of claim 10, wherein the thickness of the piezoelectric film, and the mass of the first and second electrodes are approximately equal for each of the film bulk acoustic resonators.

* * * * *